United States Patent [19]
Aoki et al.

[11] Patent Number: 5,578,193
[45] Date of Patent: Nov. 26, 1996

[54] METHOD AND APPARATUS FOR WET TREATMENT OF SOLID SURFACES

[75] Inventors: Hidemitsu Aoki; Tsutomu Nakajima, both of Tokyo, Japan

[73] Assignee: NEC Corporation, Tokyo, Japan

[21] Appl. No.: 501,431

[22] Filed: Jul. 12, 1995

Related U.S. Application Data

[63] Continuation of Ser. No. 179,339, Jan. 10, 1994, abandoned.

[30] Foreign Application Priority Data

| Jan. 8, 1993 | [JP] | Japan | 5-017954 |
| Apr. 9, 1993 | [JP] | Japan | 5-105991 |
| Aug. 10, 1993 | [JP] | Japan | 5-218211 |

[51] Int. Cl.$^6$ .................................. C02F 1/461
[52] U.S. Cl. .......... 205/746; 205/747; 205/751; 204/263; 204/157.15; 134/902; 437/936
[58] Field of Search ................ 204/263, 433, 204/435, 157.52, 157.4, 157.5, 157.15; 134/902; 437/936; 205/746, 747, 751

[56] References Cited

U.S. PATENT DOCUMENTS

| 4,857,158 | 8/1989 | Cawlfield | 204/263 |
| 5,175,124 | 12/1992 | Weinbarger | 437/180 |
| 5,234,563 | 8/1993 | Arai et al. | 204/263 |
| 5,268,092 | 12/1993 | Eden | 204/433 |

FOREIGN PATENT DOCUMENTS

| 0286233 | 10/1988 | European Pat. Off. |
| 0300793 | 1/1989 | European Pat. Off. |
| 0496605 | 7/1992 | European Pat. Off. |
| 0125203 | 10/1981 | Japan | 204/157.5 |
| 5006884 | 1/1993 | Japan | 134/902 |

OTHER PUBLICATIONS

Abstract of JP-A-4-314 408 No month & year available.
Abstract of JP-A-5 057 282 No month & year available.
Abstract of JP-A-4 193 235 No month & year available.
Abstract of JP-A-4 076 127 No month & year available.
Abstract of JP-A-4 074 587 No month & year available.
Abstract of JP-A-1 130 781 No month & year available.
Abstract of JP-A-61 268 391 No month & year available.

*Primary Examiner*—Arun S. Phasge
*Attorney, Agent, or Firm*—Sughrue, Mion, Zinn, Macpeak & Seas

[57] ABSTRACT

The object of the invention is to accomplish surface treatment such as cleaning, etching or after-treatment of parts or semi-processed articles for the manufacture of industrial or medical products without raising the problem of environmental pollution and without damaging or contaminating the treated articles. Water is electrolyzed in a tank which is partitioned by a porous membrane into an anode chamber and a cathode chamber to prepare a fresh anodic water containing $H^+$ ion in the anode chamber and a fresh cathodic water containing $OH^-$ ion in the cathode chamber. The fresh anodic water and the fresh cathodic water are separately discharged from the electrolysis tank, and selected one of the anodic water and the cathodic water is brought into contact with the object of wet treatment. The efficiency of electrolysis of water can be enhanced by adding a small amount of an electrolysis aid such as carbon dioxide gas or ammonium acetate to water and/or by irradiating water under electrolysis with an electromagnetic wave having an wavelength not longer than 400 nm or not shorter than 3000 nm.

33 Claims, 3 Drawing Sheets

METHOD AND APPARATUS FOR WET TREATMENT OF SOLID SURFACES

This is a continuation of application Ser. No. 08/179,339 filed Jan. 10, 1994 now abandoned.

BACKGROUND OF THE INVENTION

This invention relates to a method for wet treatment of surfaces of parts and semi-processed articles for the manufacture of industrial or medical products and apparatus to perform the wet treatment method. The purpose of the wet treatment may be cleaning, etching or aftertreatment. The method and apparatus according to the invention is particularly useful for cleaning a silicon wafer for producing a semiconductor device or a dielectric film formed on the wafer.

In the manufacture of industrial or medical products, surface treatments of parts or semi-processed articles are made for various purposes such as cleaning, etching and aftertreatment. In many cases, conventional surface treatments are made by using solutions containing chlorine or another halogen or a chlorofluorohydrocarbon, acid solutions or alkaline solutions and in some cases by using gases containing a halogen or a chlorofluorohydrocarbon. In using such solutions or gases, great care must be taken to prevent environmental pollution, and safe disposal of waste solutions or gases entails heavy cost. Furthermore, in some cases, halogen compounds formed by chemical reactions during surface treatments create industrial waste that is difficult to dispose of.

SUMMARY OF THE INVENTION

It is an object of the present invention to provide a novel method for accomplishing wet treatment of surfaces of various parts and semi-finished articles for the manufacture of industrial or medical products without raising any pollution problem in the practice of surface treatment and in the disposal of waste liquid.

It is another object of the invention to provide apparatus for performing the wet treatment method according to the invention.

The present invention provides a method for wet treatment of a surface or surfaces of an article; the method comprising the steps of (a) electrolyzing water so as to prepare a fresh anodic water which contains hydrogen ion ($H^+$) and a fresh cathodic water which contains hydroxide ion ($OH^-$) and separate the anodic water and the cathodic water from each other, and (b) continuously bringing selected one of the fresh anodic water and the fresh cathodic water into contact with the surface or surfaces of the article subject to wet treatment.

In another aspect, the invention provides a wet treatment apparatus comprising an electrolysis tank provided with an anode, a cathode and a porous membrane which allows ions to pass therethrough and partitions the interior of the tank into an anode chamber in which the anode is positioned and a cathode chamber in which the cathode is positioned, water feed means for feeding purified water into the electrolysis tank, a DC power supply for applying a DC voltage between the anode and cathode in the electrolysis tank, a first treatment tank which is connected to the cathode chamber of the electrolysis tank so as to continuously receive a fresh cathodic water ($OH^-$ ion water) from the anode chamber, and a second treatment tank which is connected to the anode chamber of the electrolysis tank so as to continuously receive a fresh anodic water ($H^+$ ion water) from the anode chamber.

In this invention, the water to be electrolyzed may be pure water although the electric field strength between the anode and cathode must be made high enough to overcome the high resistivity of pure water. To enhance the efficiency of electrolysis of water, by somewhat reducing the resistivity of water it is optional to add a small amount of an electrolysis aid such as carbon dioxide gas or a suitable supporting electrolyte to water. It is desirable to suitably control the hydrogen ion concentration in the fresh anodic water and the hydroxide ion concentration in the fresh cathodic water by controlling the intensity of the DC current flowing between the anode and cathode and/or by controlling the amount of addition of the electrolysis aid. The temperature of the anodic or cathodic water used in surface treatment and the duration of the treatment are arbitrary and can be suitably determined according to the purpose of the surface treatment.

The efficiency of electrolysis of water can be enhanced also by irradiating water under electrolysis with an electromagnetic wave not longer than 400 nm in wavelength, such as ultraviolet ray or X-ray, or another electromagnetic wave not shorter than 3000 nm in wavelength such as far-infrared ray or microwave. This measure can be employed independent of the use or nonuse of an electrolysis aid.

The principal advantage of the present invention is that there is little need of taking care to prevent environmental pollution. In every wet treatment according to the invention, the disposal of waste water is very simple and easy because both the $H^+$ ion water and $OH^-$ ion water prepared by electrolysis return to neutral water in a short while. In this regard, the $H^+$ ion water and $OH^-$ ion water are not comparable to acidic and basic solutions used in conventional wet treatment methods. Even if an electrolysis aid is added to the water the amount of addition is very small, and it is possible to select an electrolysis aid that does not cause of pollution. In this invention, it is easy to reuse a large portion of waste water through, for example, a water purifier and an ion exchanger.

This invention is very useful for cleaning various parts or semi-processed articles for the manufacture of industrial or medical products, and particularly for cleaning a silicon wafer for the fabrication of a semiconductor device or a film formed on the wafer.

For example, heavy metal contaminants can be removed from a silicon wafer surface by treatment with a fresh $H^+$ ion water. If a basic water is used as the cleaning liquid, the contaminating heavy metals are liable to form complex ions having an OH group as ligand and consequently remain on the wafer surface by adsorption. When $H^+$ ion water is used, the heavy metals leave the wafer surface without forming complex ions. As another example, it is possible to remove colloidal silica used as a polishing agent from the surface of a dielectric film formed on a wafer by treatment with a fresh $OH^-$ ion water.

Also, it is possible to clean a metal surface by a method according to the invention without damaging the metal. An example is cleaning of an aluminum film which is formed in the process of fabricating a semiconductor device and finely patterned by etching with a chrorine containing gas plasma. After the etching operation, the film is treated with a fresh $H^+$ ion water to remove residual chlorine as HCl. By this treatment, the aluminum surface becomes active, but it is possible to stabilize the active aluminum surface by treatment with a fresh $OH^-$ ion water. Compared with the conventional cleaning treatment using pure water, the cleaning treatment according to the invention is more effective in preventing corrosion and has a lower possibility of damaging the patterned aluminum film or the underlying film. Compared with a conventional gas ashing treatment, the cleaning treatment according to the invention is more efficient in dissipating chlorine adhered to the patterned aluminum film because if directly induces convection on the film surface.

Furthermore, the invention can be used for etching a metal surface. A metal is stable to an acidic solution or a basic solution if the pH of the solution is within a specific range: for example, in the pH range of from about 3 to about 10 in the case of Fe. Therefore, it is possible to etch a metal surface by using either a $H^+$ ion water which has a pH below the lower boundary of the specific range or a $OH^-$ ion water which has a pH above the upper boundary of the specific range.

DESCRIPTION OF THE PREFERRED EMBODIMENTS

Figure 1:
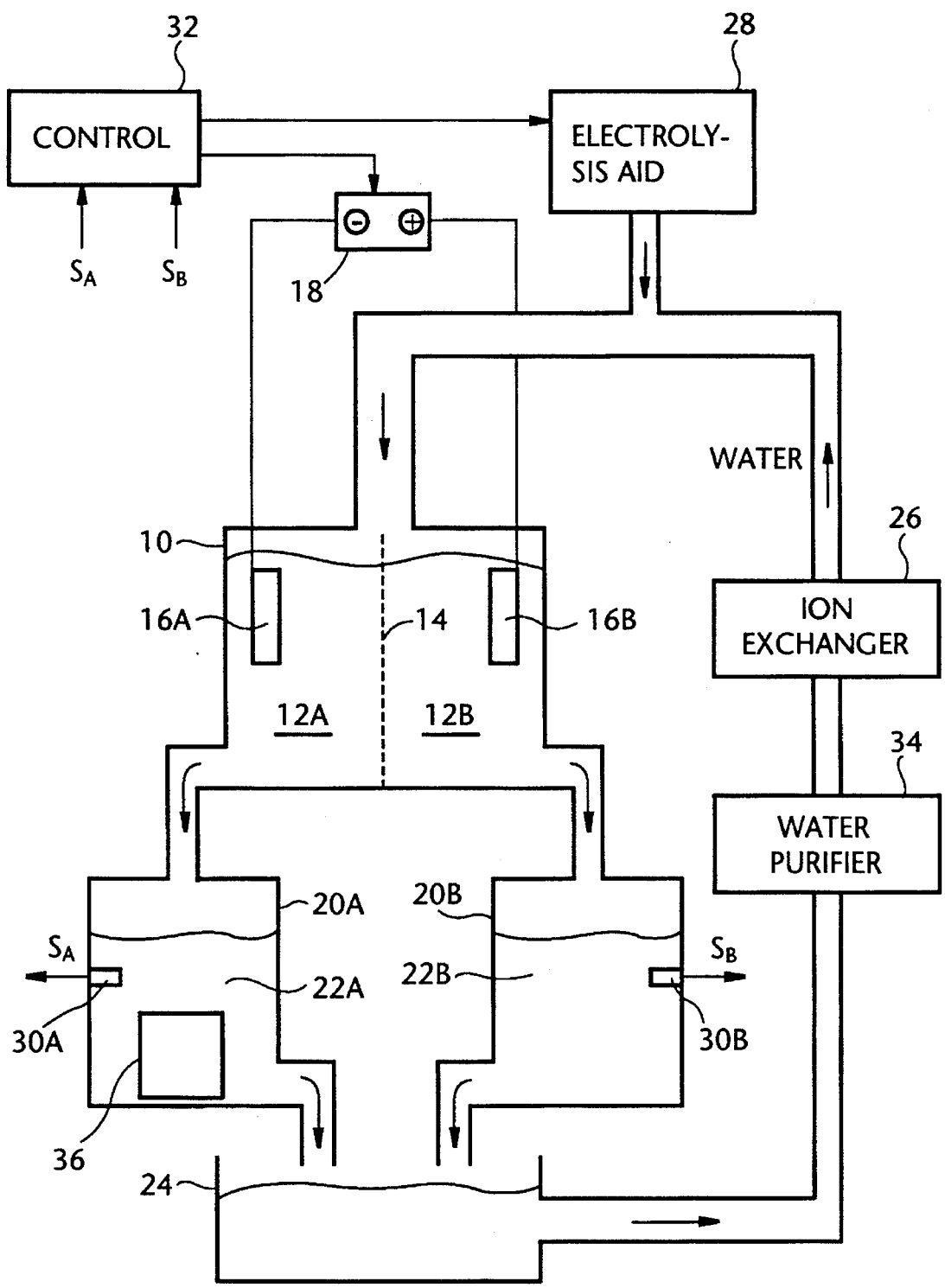
FIG. 1 is a diagrammatic illustration of a cleaning apparatus according to the invention.

FIG. 1 shows the fundamental construction of a cleaning apparatus embodying the present invention. The apparatus has an electrolysis tank 10 to electrolyze water. The interior of the tank 10 is partitioned into two chambers 12A and 12B by a porous membrane 14 such as a polysilicon membrane, and the two chambers 12A and 12B are provided with two platinum or carbon electrodes 16A and 16B, respectively. The electrodes 16A, 16B are connected to a DC power supply 18 the output of which is variable. In FIG. 1 the electrode 16A in the chamber 12A is made the cathode and the electrode 16B in the chamber 12B the anode. To electrolyze pure water at fairly good efficiency, the electric field strength between the cathode 12A and anode 12B needs to be sufficiently high. In this invention, an electric field strength of $10^3$ to $10^4$ V/cm is suitable. The electrolysis of water in the tank 10 results in the formation of $OH^-$ ion in the water in the cathode chamber 12A and $H^+$ ion in the anode chamber 12B.

The cathode chamber 12A of the tank 10 is connected to a first cleaning tank 20A and the anode chamber 12B to a second cleaning tank 20B such that a fresh cathodic water 22A containing $OH^-$ ion and a fresh anodic water containing $H^+$ ion are continuously supplied into the first cleaning tank 20A and the second cleaning tank 20B, respectively. It is desirable that each of the cleaning tanks 20A, 20B is provided with a grounding electrode (not shown) since a very high voltage (above 1 kV) is applied between the two electrodes 16A and 16B in the electrolysis tank 10 when no electrolysis aid is added to pure water or the resistivity of water remains very high despite the addition of an electrolysis aid. There is a waste water tank 24 to collect and reserve waste water flowing out of the two cleaning tanks 20A and 20B.

An ion exchanger 26 is used to supply pure water into the electrolysis tank 10. In many cases, it is favorable to lower the resistivity of pure water to thereby enhance the efficiency of electrolysis by adding an electrolysis aid to pure water. The apparatus of FIG. 1 includes an electrolysis aid feeder 28. For example, carbon dioxide gas is used as the electrolysis aid so as to bubble pure water flowing into the tank 10. Also, it is possible to use a suitable supporting electrolyte such as an ammonium salt. For example, it is suitable to use ammonium acetate when it is desired to accomplish cleaning without damaging metal or oxide surfaces of the object of cleaning. In most cleaning operations according to the invention, it is undesirable to use a supporting electrolyte having a halogen as the cation component because of possibilities of contaminating the object of cleaning. However, ammonium chloride may be used if damages to metal surfaces raise no problem, and ammonium fluoride may be used when it is intended to remove a naturally formed oxide film which is liable to contain contaminating metals represented by Fe.

The apparatus of FIG. 1 includes a pH control unit 32 which controls the output of the DC power supply 18 and the feed rate of the elecrolysis aid from the feeder 28 in order to control pH of the cathodic water and anodic water prepared in the electrolysis tank 10. The first and second cleaning tanks 20A and 20B are equipped with pH sensors 30A and 30B, respectively, and the control unit 32 makes feedback control of pH by using information (in the form of an electrical signal) $S_A$ from the pH sensor 30A and information $S_B$ from the pH sensor 30B.

To reuse a large portion of waste water, a supernatant is passed from the tank 24 to a water purifier 34, and the purified water is passed to the ion exchanger 26.

For example, the apparatus of FIG. 1 is used for cleaning silicon wafers held in a wafer carrier 36. Cleaning is accomplished by immersing the wafer carrier 36 in either the $OH^-$ ion water 22A in the first cleaning tank 20A or the $H^+$ ion water 22B in the second cleaning tank 20B. In either case the apparatus is operated such that the ion water 22A or 22B continuously runs over the surfaces of the wafers in the carrier 36. It is suitable to control pH of the $OH^-$ ion water 22A to about 9 to 10 and pH of the $H^+$ ion water 22B to about 5 to 3. If desired, silicon wafers may be cleaned with both the $OH^-$ ion water 22A and the $H^+$ ion water 22B, first with $OH^-$ ion water 22A and then with $H^+$ ion water 22B or reversely.

In the fabrication of recent semiconductor integrated circuits with very high integration of very fine components, it is very important to use wafers having a very smooth and clean surface. Therefore, it is prevailing to smoothen the surface of a silicon wafer or a dielectric film formed on a wafer by polishing with a slurry containing colloidal silica. After the polishing operation, there is the need of removing residual colloidal silica from the polished surface, and for this purpose, it is known to use a mixed aqueous solution of ammonia and hydrogen peroxide as a cleaning liquid. However, with this solution, complete removal of the residucal colloidal silica becomes difficult if the colloidal silica dries before the cleaning operation. Besides, this solution is not applicable when aluminum parts such as wiring lines are exposed on a dielectric film surface to be cleaned since the solution is strongly basic and dissolves aluminum. Even in the case of a dielectric film completely covering aluminum wirings, there is a possibility of erosion of the aluminum wirings by permeation of the cleaning solution through pinholes in the dielectric film. Furthermore, due to strong basicity of the cleaning solution, the disposal of waste solution entails high cost and needs great care to prevent environmental pollution.

Figure 2A:
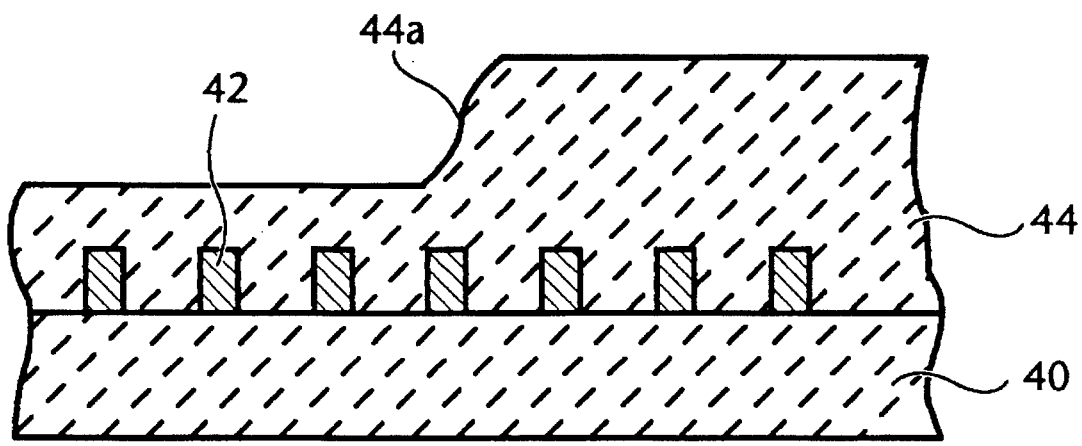
FIG. 2(A) is a schematic, fragmentary and sectional illustration of an interlayer dielectric film formed in a process of producing a semiconductor device having a multilayer structure.
Figure 2B:
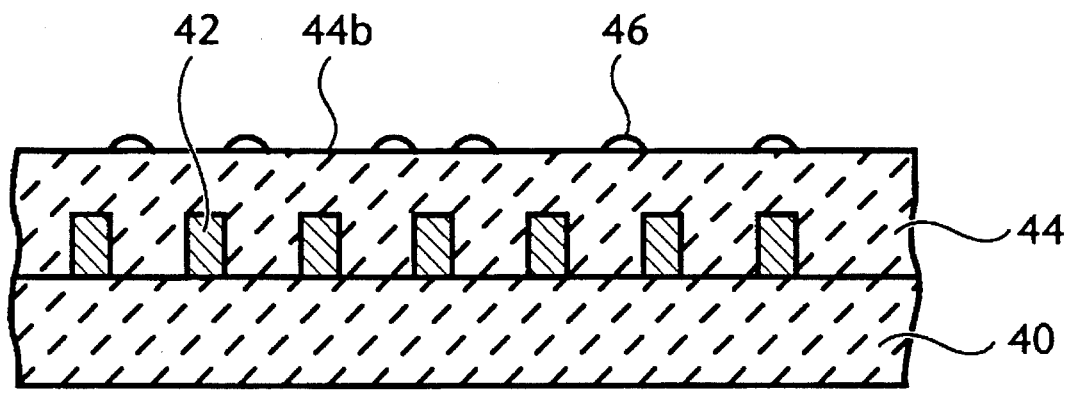
FIG. 2(B) illustrates the result of planarization of the dielectric film in FIG. 2(A) by a conventional method.

The removal of colloidal silica can easily be accomplished by a method according to the invention. FIG. 2(A) shows a part of an unfinished semiconductor device having a multilayer structure. On a wafer (not shown), aluminum wiring lines 42 are formed on an underlaid dielectric film 40 and overlaid with and buried in another interlayer dielectric film 44. Usually the dielectric films 40, 44 are silicon oxide films formed by a CVD process. The dielectric film 44 has steps as indicated at 44a. To planarize the dielectric film 44 by removing the steps, the film 44 is polished with a colloidal silica slurry. The result is illustrated in FIG. 2(B). The planarized dielectric film 44 has a flat and smooth surface 44b, but some colloidal silica 46 remains on the film surface 44b. To remove the residual colloidal silica 46 by using the cleaning apparatus of FIG. 1, the wafer having the dielectric layer 44 in the state of FIG. 2(B) is immersed in the OH$^-$ ion water 22A in the first cleaning tank 20A. In this case, the pH of the OH$^-$ ion water is controlled to about 9 to 10, and the OH$^-$ ion water is heated at about 70° C. For complete removal of the colloidal silica 46, it suffices to continue cleaning with the OH$^-$ ion water for about 5 to 10 min. After that, the wafer is washed with pure water for a few minutes. This method is effective even when the colloidal silica 46 has dried before the cleaning operation. Although the cleaning water (OH$^-$ ion water) used in this method is a basic liquid, this water returns to neutral water with the lapse of time because the electrolytically formed OH$^-$ ions in this water are not stable for a long time. Besides, pH of the cleaning water can be adequately controlled so as not to easily erode aluminum. Therefore, even if the cleaning water permeates into the dielectric film 44 through pinholes, there is no possibility of erosion of the aluminum wirings 42, and the disposal of waste water raises little problem.

Figure 3:
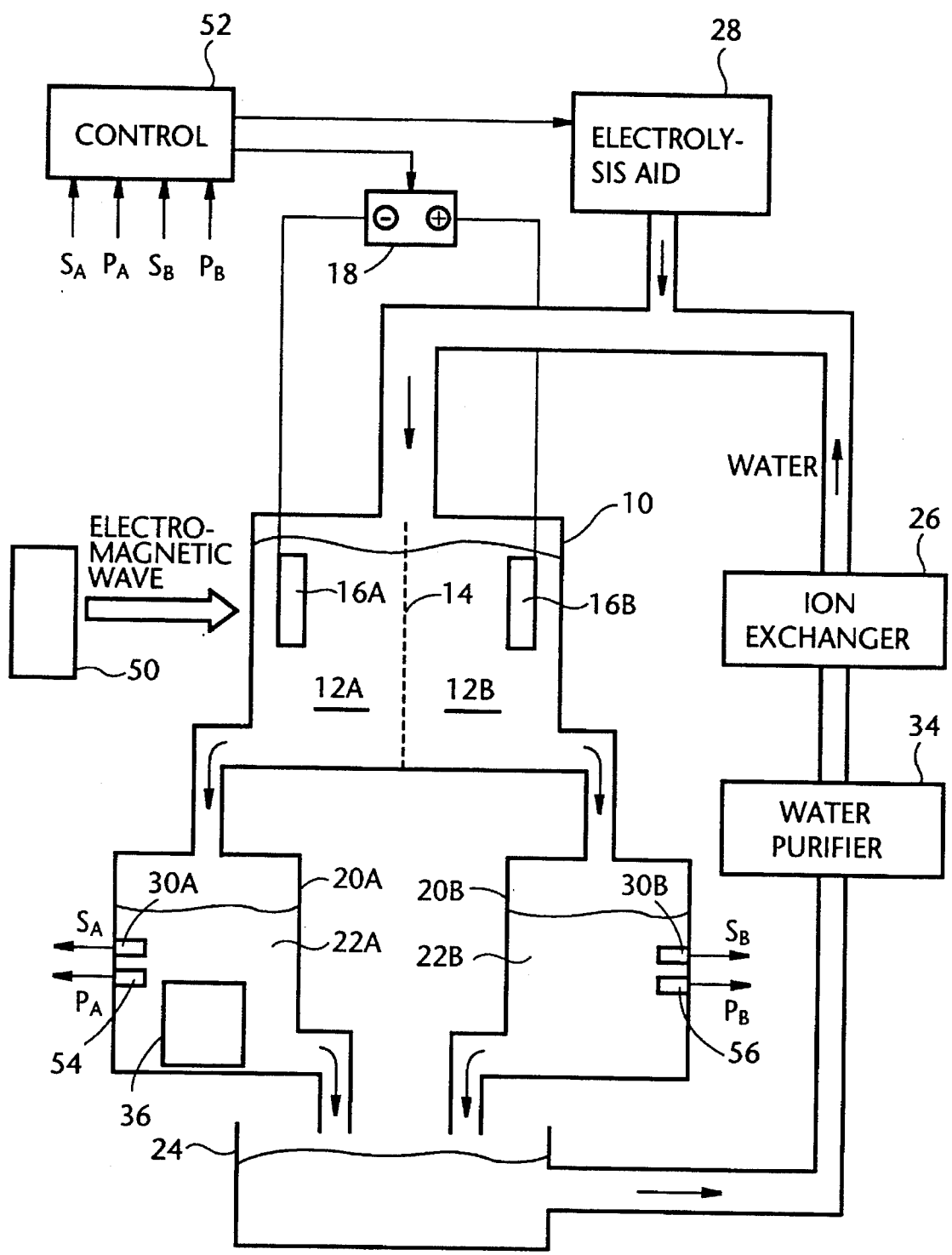
FIG. 3 shows a modification of the cleaning apparatus of FIG. 1.

FIG. 3 shows a modification of the cleaning apparatus of FIG. 1. The purpose of the modification is to further enhance the efficiency of electrolysis of water in the tank 10. In addition to the components shown in FIG. 1, there is an electromagnetic wave radiation source 50 which is arranged so as to irradiate water in both the cathode and anode chambers 12A and 12B, at least in the section where the electrodes 16A and 16B are positioned, with a selected electromagnetic wave which is either a relatively short wave not longer than 400 nm in wavelength or a relatively long wave not shorter than 3000 nm in wavelength. For example, either ultraviolet ray or X-ray is useful as the short wave and either far-infrared ray or microwave as the long wave. In this case the electrolysis tank 10 is made of a transparent material such as quartz. The pH control unit 32 in FIG. 1 is modified to a control unit 52 which controls the radiation of the electromagnetic wave from the radiation source 50 as well as the output of the DC power supply 18 and the operation of the electrolysis aid feeder 28. A reduction potential sensor 54 is provided to the first cleaning tank 20A and an oxidation potential sensor 56 to the second cleaning tank 20B, and information (in the form an electrical signal) $P_A$ from the sensor 54 and information $P_B$ from the sensor 56 are supplied to the control unit 52 in order to make feedback control of the radiation source 50 in respect of the intensity of radiation or the duration of radiation.

An electromagnetic wave with a wavelength not longer than 400 nm has high energy. Electrolysis of water can be promoted by irradiating water with a high energy wave for the following reasons. In the case of, for example, electrolyzing 0.1N aqueous solution of NaOH, the energy level for generation of oxygen is lower than the standard, saturated calomel electrode (SCE) potential by 0.16 eV, and the energy level for generation of hydrogen is higher than the SCE potential by 1.07 eV. Therefore, in theory, the minimum voltage needed to electrolyze the aqueous solution is 1.23 eV (0.16 eV+1.07 eV). In this invention, it is necessary to apply a much higher voltage between the opposite electrodes because the object of electrolysis is either pure water or a very dilute aqueous solution of a supporting electrolyte. Besides, an overvoltage is necessary for establishment of a current flow between the two electrodes. The high resistivity of water is compensated to some extent by irradiation with a high energy electromagnetic wave. The irradiation may be continued throughout the duration of the electrolysis operation, but it is also effective to perform the irradiation only at an initial stage of the electrolysis operation until the electrolysis current reaches a steady level.

The irradiation of water with an electromagnetic wave with a long wavelength, not shorter than 300 nm, is effective for breaking clusters of water molecules and promoting ionization of water under electrolysis. Also, in this case, the irradiation may be performed throughout the duration of the electrolysis operation or only at an initial stage of the electrolysis operation.

What is claimed is:

1. A method for wet treatment of a surface or surfaces of an inorganic material part for producing a semiconductor device, wherein said part is located outside of an electrolysis tank, comprising the steps of:

(a) electrolyzing purified water in the electrolysis tank to prepare a fresh anodic water which contains hydrogen ion (H$^+$) and a fresh cathodic water which contains hydroxide ion (OH$^-$);

(b) separating the anodic water and the cathodic water from each other; and (c) separately drawing the fresh anodic water and the fresh cathodic water out of said electrolysis tank to continuously and selectively bring said fresh anodic water and said fresh cathodic water into contact with the surface or surfaces of the inorganic material part subject to wet treatment, wherein said drawing step is performed immediately after said separating step.

2. A method according to claim 1, further comprising, after step (b), the step of continuously bringing the other of said fresh anodic water and said fresh cathodic water into contact with the surface or surfaces of the article subject to wet treatment.

3. A method according to claim 1, wherein step (a) comprises the sub-step of controlling the intensity of a DC current which causes electrolysis of the water to thereby control the hydrogen ion concentration in said fresh anodic water and the hydroxide ion concentration in said fresh cathodic water.

4. A method according to claim 1, wherein step (a) comprises the sub-step of adding an electrolysis aid to the water to be electrolyzed to thereby enhance the efficiency of the electrolysis of water.

5. A method according to claim 4, wherein said electrolysis aid is carbon dioxide gas.

6. A method according to claim 4, wherein said electrolysis aid is a water soluble ammonium salt.

7. A method according to claim 6, wherein said ammonium salt is ammonium acetate.

8. A method according to claim 4, wherein step (a) further comprises the sub-step of controlling the amount of addition of said electrolysis aid to thereby control the hydrogen ion concentration in said fresh anodic water and the hydroxide ion concentration in said fresh cathodic water.

9. A method according to claim 1, further comprising the step of irradiating the water under electrolysis with an electromagnetic wave which is not longer than 400 nm in wavelength to thereby enhance the efficiency of the electrolysis of water.

10. A method according to claim 9, wherein the irradiation of the water with said electromagnetic wave is continued through the duration of step (a).

11. A method according to claim 9, wherein the irradiation of the water with said electromagnetic wave is performed only at an initial stage of step (a) until the electrolysis current reaches a steady state.

12. A method according to claim 9, wherein the intensity of said electromagnetic wave is controlled to thereby control the hydrogen ion concentration in said fresh anodic water and the hydroxide ion concentration in said fresh cathodic water.

13. A method according to claim 1, wherein said article is a silicon wafer used in the fabrication of a semiconductor device.

14. A method according to claim 1, further comprising the step of irradiating the water under electrolysis with an electromagnetic wave which is not shorter than 3000 nm in wavelength to enhance the efficiency of the electrolysis of water.

15. A method according to claim 14, wherein the irradiation of the water with said electromagnetic wave is continued throughout the duration of step (a).

16. A method according to claim 14, wherein the irradiation of the water with said electromagnetic wave is performed only at an initial stage of step (a) until the electrolysis current reaches a steady state.

17. A method according to claim 14, wherein the intensity of said electromagnetic wave is controlled to thereby control the hydrogen ion concentration in said fresh anodic water and the hydroxide ion concentration in said fresh cathodic water.

18. A method of cleaning the surface of a dielectric film formed in a process of producing a semiconductor device, wherein the film surface is possibly contaminated with colloidal silica, the method comprising the steps of:

disposing said dielectric film at a location outside of an electrolysis tank;

electrolyzing purified water in said electrolysis tank to prepare a fresh anodic water which contains hydrogen ions ($H^+$) and a fresh cathodic water which contains hydroxide ion ($OH^-$);

separating the anodic water and the cathodic water from each other; and separately drawing the fresh anodic water and the fresh cathodic water out of said electrolysis tank to continuously bring fresh cathodic water into contact with the surface of the dielectric film at said location outside of said electrolysis tank.

19. An apparatus for wet treatment of a surface or surfaces of an inorganic material part, comprising:

an electrolysis tank provided with an anode, a cathode and a porous membrane which allows ions to pass therethrough and partitions the tank into an anode chamber in which the anode is positioned and a cathode chamber in which the cathode is positioned;

water feed means for feeding purified water into said electrolysis tank;

a DC power supply means for applying a DC voltage between said anode and said cathode;

an electromagnetic radiation means for irradiating water in the anode and cathode chambers of said electrolysis tank with an electromagnetic wave not longer than 400 nm in wavelength;

a first treatment tank for receiving the inorganic material part subject to wet treatment, said first treatment tank is connected to said cathode chamber of said electrolysis tank to continuously receive fresh cathodic water which is prepared by the electrolysis of water and contains hydroxide ion ($OH^-$) from said cathode chamber; and a second treatment tank for receiving the inorganic material part subject to wet treatment, said second treatment tank is connected to said anode chamber of said electrolysis tank to continuously receive a fresh anodic water which is prepared by the electrolysis of water and contains hydrogen ion ($H^+$) from said anode chamber.

20. An apparatus according to claim 19, further comprising means for detecting the hydrogen ion concentration in said fresh anodic water, means for detecting the hydroxide ion concentration in said fresh cathodic water and means for controlling the output of said DC power supply means based on at least one of the detected hydrogen ion concentration and the detected hydroxide ion concentration.

21. An apparatus according to claim 19, further comprising means for adding an electrolysis aid to the water to be fed into said electrolysis tank to thereby enhance the efficiency of electrolysis of water.

22. An apparatus according to claim 21, further comprising means for detecting the hydrogen ion concentration in said fresh anodic water, means for detecting the hydroxide ion concentration in said fresh cathodic water and means for controlling the amount of addition of said electrolysis aid based on at least one of the detected hydrogen ion concentration and the detected hydroxide ion concentration.

23. An apparatus according to claim 19, further comprising means for detecting the oxidation potential in the fresh anodic water supplied into said second treatment tank, means for detecting the reduction potential in the fresh cathodic water supplied into said first treatment tank and means for controlling the output of said electromagnetic radiation means.

24. An apparatus according to claim 19, further comprising a waste water tank to which both said first treatment tank and said second treatment tank are connected and a water purifier which is connected to said waste water tank and to said water feed means.

25. An apparatus for wet treatment of a surface or surfaces of an inorganic material part, comprising:

an electrolysis tank provided with an anode, a cathode and a porous membrane which allows ions to pass therethrough and partitions the tank into an anode chamber in which the anode is positioned and a cathode chamber in which the cathode is positioned;

water feed means for feeding purified water into said electrolysis tank;

a DC power supply means for applying a DC voltage between said anode and said cathode;

an electromagnetic radiation means for irradiating water in the anode and cathode chambers of said electrolysis tank with an electromagnetic wave not shorter than 3000 nm in wavelength;

a first treatment tank for receiving the inorganic material part subject to wet treatment, said first treatment tank is connected to said cathode chamber of said electrolysis tank to continuously receive fresh cathodic water which is prepared by the electrolysis of water and contains hydroxide ion (OH⁻) from said cathode chamber; and a second treatment tank for receiving the inorganic material part subject to wet treatment, said second treatment tank is connected to said anode chamber of said electrolysis tank to continuously receive a fresh anodic water which is prepared by the electrolysis of water and contains hydrogen ion (H⁺) from said anode chamber.

26. An apparatus according to claim 25, further comprising means for detecting the oxidation potential in the fresh anodic water supplied into said second treatment tank, means for detecting the reduction potential in the fresh cathodic water supplied into said first treatment tank and means for controlling the output of said electromagnetic radiation means.

27. An apparatus according to claim 25, further comprising means for detecting the hydrogen ion concentration in said fresh anodic water, means for detecting the hydroxide ion concentration in said fresh cathodic water, and means for controlling the output of said DC power supply means based on at least one of the detected hydrogen ion concentration and the detected hydroxide ion concentration.

28. An apparatus according to claim 25, further comprising means for adding an electrolysis aid to the water to be fed into said electrolysis tank to enhance the efficiency of electrolysis of water.

29. An apparatus according to claim 28, further comprising means for detecting the hydrogen ion concentration in said fresh anodic water, means for detecting the hydroxide ion concentration in said fresh cathodic water, and means for controlling the amount of addition of said electrolysis aid based on at least one of the detected hydrogen ion concentration and the detected hydroxide ion concentration.

30. An apparatus according to claim 25, further comprising a waste water tank to which both said first treatment tank and said second treatment tank are connected and a water purifier which is connected to said waste water tank and to said water feed means.

31. A method of cleaning the surfaces of a silicon wafer for use in the fabrication of a semiconductor device, the method comprising the steps of:

(a) electrolyzing water in an electrolysis tank to prepare a fresh anodic water which contains hydrogen ion (H⁺) and a fresh cathodic water which contains hydroxide ion (OH⁻) and separating the anodic water and the cathodic water from each other; and (b) separately drawing the fresh anodic water and the fresh cathodic water out of said electrolysis tank and washing the silicon wafer surfaces with selected one of the fresh anodic water and the fresh cathodic water.

32. A method according to claim 31, further comprising, after step (b), the step of washing the silicon wafer surfaces with the other of the fresh anodic water and the fresh cathodic water.

33. An apparatus for wet treatment of a surface or surfaces of an inorganic material part, comprising:

an electrolysis tank provided with an anode, a cathode and a porous membrane which allows ions to pass therethrough and partitions the tank into an anode chamber in which the anode is positioned and a cathode chamber in which the cathode is positioned;

water feed means for feeding purified water into said electrolysis tank;

a DC power supply means for applying a DC voltage between said anode and said cathode;

an electromagnetic radiation means for irradiating water in the anode and cathode chambers of said electrolysis tank with an electromagnetic wave;

a first treatment tank for receiving the inorganic material part subject to wet treatment, said first treatment tank is connected to said cathode chamber of said electrolysis tank to continuously receive fresh cathodic water which is prepared by the electrolysis of water and contains hydroxide ion (OH⁻) from said cathode chamber; and a second treatment tank for receiving the inorganic material part subject to wet treatment, said second treatment tank is connected to said anode chamber of said electrolysis tank to continuously receive a fresh anodic water which is prepared by the electrolysis of water and contains hydrogen ion (H⁺) from said anode chamber.

* * * * *

UNITED STATES PATENT AND TRADEMARK OFFICE
CERTIFICATE OF CORRECTION

PATENT NO. : 5,578,193
DATED : November 26, 1996
INVENTOR(S) : Hidemitsu AOKI, et al.

It is certified that error appears in the above-indentified patent and that said Letters Patent is hereby corrected as shown below:

Column 6, line 20, delete "300" and insert -- 3,000 --.

Column 6, line 48, delete "article" and insert -- organic material part --.

Column 7, line 21, delete "article" and insert -- organic material part --.

Signed and Sealed this

Fourth Day of March, 1997

Attest:

BRUCE LEHMAN

Attesting Officer  Commissioner of Patents and Trademarks